United States Patent
Ilani et al.

(10) Patent No.: US 9,824,760 B2
(45) Date of Patent: Nov. 21, 2017

(54) SYSTEMS AND METHODS OF GENERATING SHAPED RANDOM BITS

(71) Applicant: SANDISK TECHNOLOGIES INC., Plano, TX (US)

(72) Inventors: Ishai Ilani, Dolev (IL); Eran Sharon, Rishon Lezion (IL); David Rozman, Kiryat-Malakhi (IL)

(73) Assignee: SanDisk Technologies LLC, Plano, TX (US)

( * ) Notice: Subject to any disclaimer, the term of this patent is extended or adjusted under 35 U.S.C. 154(b) by 195 days.

(21) Appl. No.: 14/812,464

(22) Filed: Jul. 29, 2015

(65) Prior Publication Data
US 2017/0032843 A1 Feb. 2, 2017

(51) Int. Cl.
G06F 7/58 (2006.01)
G11C 16/10 (2006.01)
G06F 12/00 (2006.01)
G06F 13/00 (2006.01)
G11C 29/36 (2006.01)
G11C 29/42 (2006.01)
G11C 16/04 (2006.01)

(52) U.S. Cl.
CPC .............. *G11C 16/10* (2013.01); *G06F 7/588* (2013.01); *G06F 12/00* (2013.01); *G06F 13/00* (2013.01); *G11C 29/36* (2013.01); *G11C 29/42* (2013.01); *G11C 16/0483* (2013.01)

(58) Field of Classification Search
None
See application file for complete search history.

(56) References Cited

U.S. PATENT DOCUMENTS

| | | | | |
|---|---|---|---|---|
| 4,853,884 A | * | 8/1989 | Brown | G06F 7/588 331/78 |
| 2005/0193045 A1 | * | 9/2005 | Yamamoto | G06F 7/588 708/250 |
| 2012/0226724 A1 | * | 9/2012 | Radwan | G06F 7/58 708/204 |
| 2016/0268000 A1 | * | 9/2016 | Thompson | G11C 16/30 |
| 2017/0032843 A1 | * | 2/2017 | Ilani | G11C 16/10 |

OTHER PUBLICATIONS

"Combination Logic", Wikipedia, http://en.wikipedia.org/wiki/Combinational_Logic, Mar. 12, 2015, 3 pages.
"Generating random strings", Wiki, http://wiki.tcl.tk/3757, Mar. 12, 2015, 2 pages.
Cover, Thomas M. and Joy A. Thomas, Elements of Information Theory, 2nd Ed., 2006, Wiley, Hoboken, New Jersey, U.S.A., 748 pages.

* cited by examiner

*Primary Examiner* — David Malzahn
(74) *Attorney, Agent, or Firm* — Toler Law Group, PC

(57) ABSTRACT

A device includes a non-volatile memory and a controller coupled to the non-volatile memory. The controller is configured to initiate writing of first data to a first portion of a group of storage elements of the non-volatile memory. The controller is further configured to initiate writing of shaped dummy data to a second portion of the group of storage elements.

20 Claims, 9 Drawing Sheets

SYSTEMS AND METHODS OF GENERATING SHAPED RANDOM BITS

FIELD OF THE DISCLOSURE

This disclosure is generally related to generating random bits.

BACKGROUND

"Shaped" data may be used during testing of a storage device. For example, the storage device may be programmed using data having different shaping levels (e.g., different ratios of 1s to 0s) to test the performance of the storage device. One way of generating shaped data is to use a parallel random number generator. The parallel random number generator may generate a sequence of multiple bits in parallel, where each bit has a 50% chance of being a 0 and a 50% chance of being a 1. The randomly generated bit sequence may then be used to generate the shaped bits, for example, by changing certain bits of the bit sequence from 0 to 1, or vice versa.

DETAILED DESCRIPTION

Figure 1:
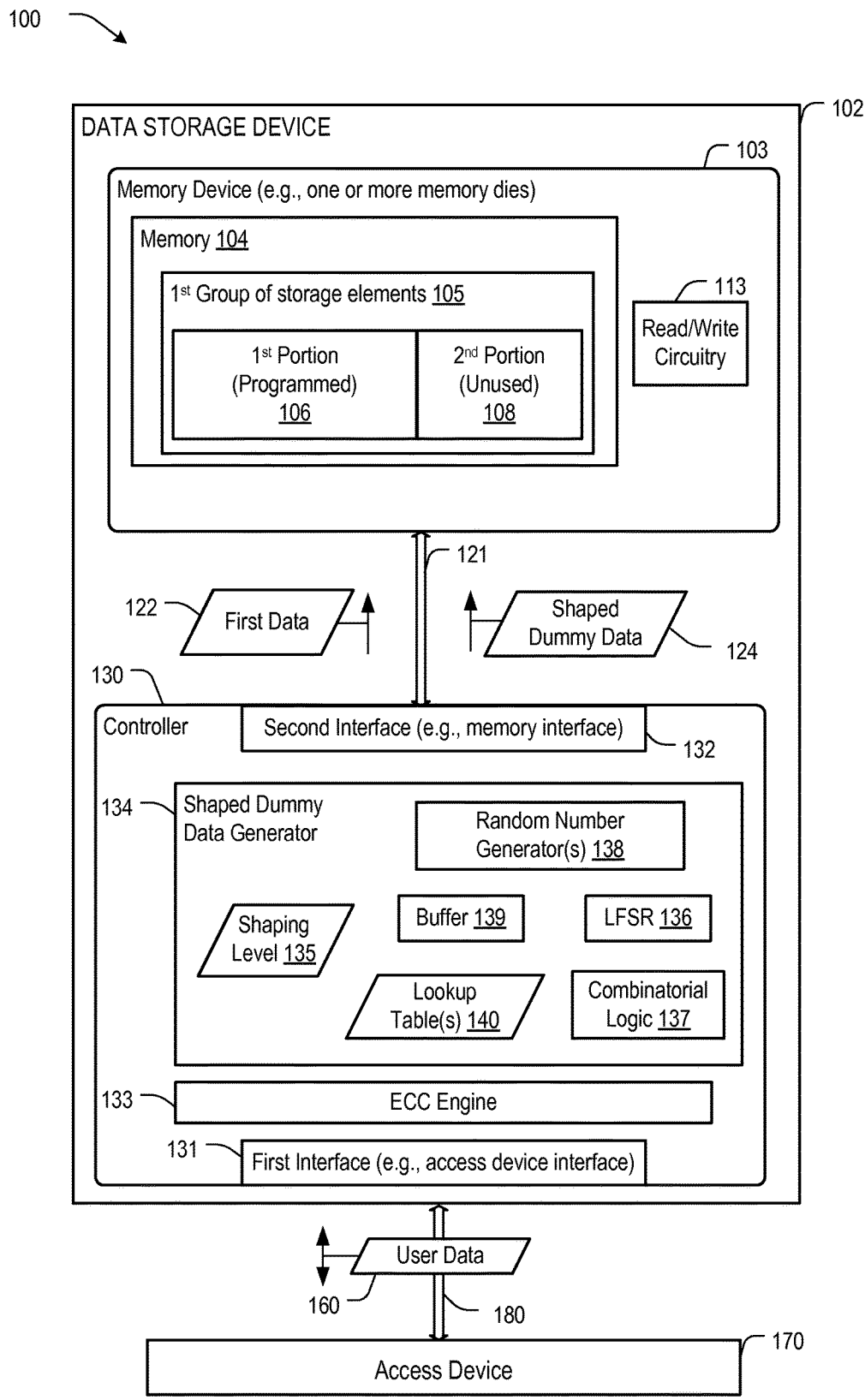
FIG. 1 is a block diagram of a particular illustrative example of a system including a data storage device including components that are operable to generate shaped random bits.

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

The present disclosure describes systems and methods of generating and using shaped data, such as shaped dummy data. In some implementations, the shaped data may be used during device testing. For example, the storage device may be programmed using data having different shaping levels (e.g., different ratios of 1s to 0s) to test the performance of the storage device. Additionally or alternatively, the shaped data may be written to memory during write operations in certain conditions other than device testing. For example, shaped dummy data may be programmed to unused portions of a partially programmed block of a memory. The shaped dummy data may reduce wear, which can increase an endurance of a memory, as compared to storing independent, identically distributed (i.i.d.) random data.

To illustrate, a non-volatile memory, such as a NAND flash memory, may be divided into a plurality of blocks. During operation at the non-volatile memory, a stream of user data may be received from an access (e.g., host) device for writing to a block of the non-volatile memory. Depending on the amount of user data to be written, the stream of user data may end before the entire block of the non-volatile memory is written. In such situations, "dummy" data, such as shaped dummy data, may be written to the rest of the block. For example, the shaped dummy data may be generated to have a fixed (e.g., predetermined) shaping level. As another example, when user data was previously written to a first portion of a block and the shaped dummy data is to be written to a remainder (e.g., a second portion) of the block, the shaped dummy data may be generated to have the same shaping level as the user data. By storing the shaped dummy data, as compared to storing i.i.d. random data, wear on a memory may be reduced, which can increase an endurance of the memory.

In a first illustrative example, shaped dummy data may be generated using combinatorial logic in conjunction with a linear feedback shift register (LFSR). The LFSR may generate a sequence of bits, such as $LFSR_{i-4}$, $LFSR_{i-3}$, $LFSR_{i-2}$, $LFSR_{i-1}$, $LFSR_i$, etc., where i is a positive integer. A target shaping level may be selected as a fixed (e.g., preprogrammed) target shaping level or may be selected based on one or more factors, such as a shaping level of user data. Depending on the target shaping level, one or more of the bits generated by the LFSR may be combined using combinatorial logic. For example, if a target shaping level is 50% (equal ratio of 1s to 0s), then $LFSR_i$ may be used to generate the next bit of shaped dummy data. As another example, if a target shaping level is 75% (75% 1s and 25% 0s), then $LFSR_i$ may be logically ORed with $LFSR_{i-1}$ to generate the next bit of shaped dummy data. Other shaping levels (e.g., 56.25%, 62.5%, 68.75%, 81.25%, 87.5%, 93.75%, etc.) may be implemented using other combinatorial logic.

In a second illustrative example, shaped dummy data may be generated by processing a randomly generated sequence of bits using a parallel/residual method with a lookup table. For example, a random 4-bit sequence may be generated. For a 75% shaping level, the lookup table may indicate that the next bit of the shaped dummy data will be 0 when the 4-bit sequence has the values 0000, 0001, 0010, or 0011. For the remaining twelve possible values of the 4-bit sequence (0100-1111), the lookup table may indicate that the next bit of the shaped dummy data will be 1. Thus, even though four random bits are generated, in some situations fewer than all four bits may be needed to determine the next bit of shaped dummy data. To illustrate, in the 75% shaping example, if the first bit of the 4-bit sequence is 1, then the next bit of dummy data will be 1, regardless of the values of the three remaining bits in the 4-bit sequence. In this scenario, the three remaining bits may be considered "unused" and may be stored in a buffer as a residual instead of being discarded. When four residual bits have been accumulated in the buffer, the residual bits may collectively be used as a new randomly generated 4-bit sequence, which may conserve resources as compared to generating a new 4-bit sequence using a parallel random number generator.

FIG. 1 depicts an illustrative example of a system 100. The system 100 includes a data storage device 102 and an access device 170. The data storage device 102 includes a controller 130 and a memory device 103 that is coupled to the controller 130. The memory device 103 may include one or more memory dies.

The data storage device 102 and the access device 170 may be operationally coupled via a connection (e.g., a communication path 180), such as a bus or a wireless connection. The data storage device 102 may include a first interface 131 (e.g., an access device interface) that enables communication via the communication path 180 between the data storage device 102 and the access device 170, such as when the first interface 131 is communicatively coupled to the access device 170.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

In some implementations, the data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 170 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The access device 170 may include a memory interface (not shown) and may be configured to communicate with the data storage device 102 via the memory interface to read data from and write data to the memory device 103 of the data storage device 102. For example, the access device 170 may operate in compliance with a Joint Electron Devices Engineering Council (JEDEC) industry specification, such as a Universal Flash Storage (UFS) Access Controller Interface specification. As other examples, the access device 170 may operate in compliance with one or more other specifications, such as a Secure Digital (SD) Access Controller specification, as an illustrative, non-limiting example. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as user data 160, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks, such as a NAND flash erase group of storage elements. To illustrate, the memory 104 may include a first group of storage elements 105 (e.g., also referred to herein as a group of memory cells). The first group of storage elements 105 may be configured as a physical page, a word line, or a block, as illustrative, non-limiting examples. Although the memory 104 is depicted as including a single group of storage elements, in other implementations, the memory 104 includes more than one group of storage elements. For example, when the first group of storage elements 105 corresponds to a block, the memory 104 may include multiple blocks.

Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 113, to support operation of one or more memory dies of the memory device 103. Although depicted as a single component, the read/write circuitry 113 may be divided into separate components of the memory device 103, such as read circuitry and write circuitry. The read/write circuitry 113 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 130 is coupled to the memory device 103 via a bus 121, an interface (e.g., interface circuitry, such as a second interface 132), another structure, or a combination thereof. For example, the bus 121 may include one or more channels to enable the controller 130 to communicate with a single memory die of the memory device. As another example, the bus 121 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 131, and the controller 130 may receive data from the access device 170 via the first interface 131. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 may include a shaped dummy data generator 134 and an error correction code (ECC) engine 133. The ECC engine 133 may be configured to receive data, such as the user data 160, and to generate one or more ECC codewords (e.g., including a data portion and a parity portion) based on the data. For example, the ECC engine 133 may receive the user data 160 and may generate a codeword. To illustrate, the ECC engine 133 may include an encoder configured to encode the data using an ECC encoding technique. The ECC engine 133 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine 133 may include a decoder configured to decode data read from the memory 104 to detect and correct bit errors that may be present in the data. For example, the ECC engine 133 may correct a number of bit errors up to an error correction capability of an ECC technique used by the ECC engine 133. In some implementations, the ECC engine 133 may be configured to determine and/or track a failed bit count (FBC), a bit error rate, or both, corresponding to data decoded by the ECC engine 133.

In some implementations, the shaped dummy data generator 134 may comprise a packaged functional hardware unit designed for use with other components. In other implementations, the shaped dummy data generator 134 may comprise a portion of a program code (e.g., software or firmware) executable by a (micro)processor or processing circuitry that usually performs a particular function of related functions. Additionally or alternatively, the shaped dummy data generator 134 may comprise a self-contained hardware or software component that interfaces with a larger system, as illustrative, non-limiting examples.

The shaped dummy data generator 134 may be configured to generate shaped dummy data, such as shaped dummy data 124. The shaped dummy data generator 134 may include one or more lookup tables 140, a shaping level 135 (e.g., a target shaping level), a linear feedback shift register (LFSR) 136, combinatorial logic 137, a buffer 139, and one or more random number generators (RNG(s)) 138.

The shaping level 135 may indicate a target shaping level (e.g., a percentage of logical ones) for shaped dummy data generated by the shaped dummy data generator 134. In some implementations, the shaping level 135 may be equal to a fixed value. In other implementations, the shaping level 135 may have a value that is selected from a set of shaping values. For example, the set of shaping values may include 50%, 56.25%, 62.5%, 68.75%, 75%, 81.25%, 87.5%, 93.75%, or a combination thereof, as illustrative, non-limiting examples. In some implementations, the shaping level 135 may be based on the user data 160 (e.g., the first data 122). For example, the shaping level 135 may be selected based on or equal to a shaping level of the user data 160 (e.g., the first data 122). To illustrate, the controller 130 may be configured to count a number of bits of the user data 160 having a logical one value to determine a shaping level of the shaped dummy data and/or to determine a percentage of bits of the user data 160 having a logical one value. The shaping level 135 may be selected as one of the values of the set of shaping values that is closest to the percentage of bits of the user data 160 having the logical one value.

Each of the one or more RNGs 138 may be configured to generate a random bit value, such as one random bit value per clock cycle. The buffer 139 may be configured to store one or more bit values. For example, the buffer 139 may be configured to store one or more bit values output by the one or more RNGs 138, the LFSR 136, the lookup table(s) 140, and/or the combinatorial logic 137. In some implementations, the buffer 139 may include a first-in, first-out buffer.

The LFSR 136 may be configured to perform a linear feedback shift operation to output a bit value. For example, the LFSR 136 may have a size of 32 bits and may be configured to output one bit value per clock cycle. The bit output by the LFSR 136 may also be provided as an input to the LFSR 136. In some implementations, the LFSR 136 may be loaded with a number (e.g., a 32 bit number). In some implementations, the LFSR 136 is included in the RNG(s) 138. For example, each of the RNGs 138 may include a LFSR 136 to generate a random bit per clock cycle.

The combinatorial logic 137 may be configurable to perform one or more logical operations (e.g., an AND operation, a NAND operation, an OR operation, a NOR operation, an XOR operation, a NOT operation, etc.) on one or more input bits. For example, the combinatorial logic 137 may perform one or more logical operations on one or more bits output by the LFSR 136. In some implementations, the combinatorial logic 137 may include hardware circuitry that is configured to perform the one or more combinatorial logic operations. Additionally or alternatively, the controller 130 may include a processor (not shown) configured to execute software instructions to cause the processor to perform at least one of the one or more combinatorial logic operations. In some implementations, the combinatorial logic 137 may be selectively configurable to perform a set of one or more logical operations according to the shaping level 135. An output of the combinatorial logic 137 may include a bit that is used to generate shaped dummy data output by the shaped dummy data generator 134. To illustrate, the shaped dummy data may be generated as a series of bits that are output by the combinatorial logic 137, as described further with reference to FIG. 3.

The lookup table(s) 140 may include one or more tables that may be used to generate shaped dummy data. For example, the lookup table(s) 140 may include a first table that indicates multiple shaping levels and, for each shaping level of the multiple shaping levels, indicates a corresponding set of one or more logical operations, as described further with reference to FIG. 2. For example, if the shaping level 135 (e.g., the target shaping level) is equal to a first value, the first table may be used to identify a first set of one or more logical operations to be performed (on a first set of inputs) by the combinatorial logic 137. As another example, if the shaping level 135 (e.g., the target shaping level) is equal to a second value, the first table may be used to identify a second set of one or more logical operations to be performed (on a second set of inputs) by the combinatorial logic 137.

Figure 3:
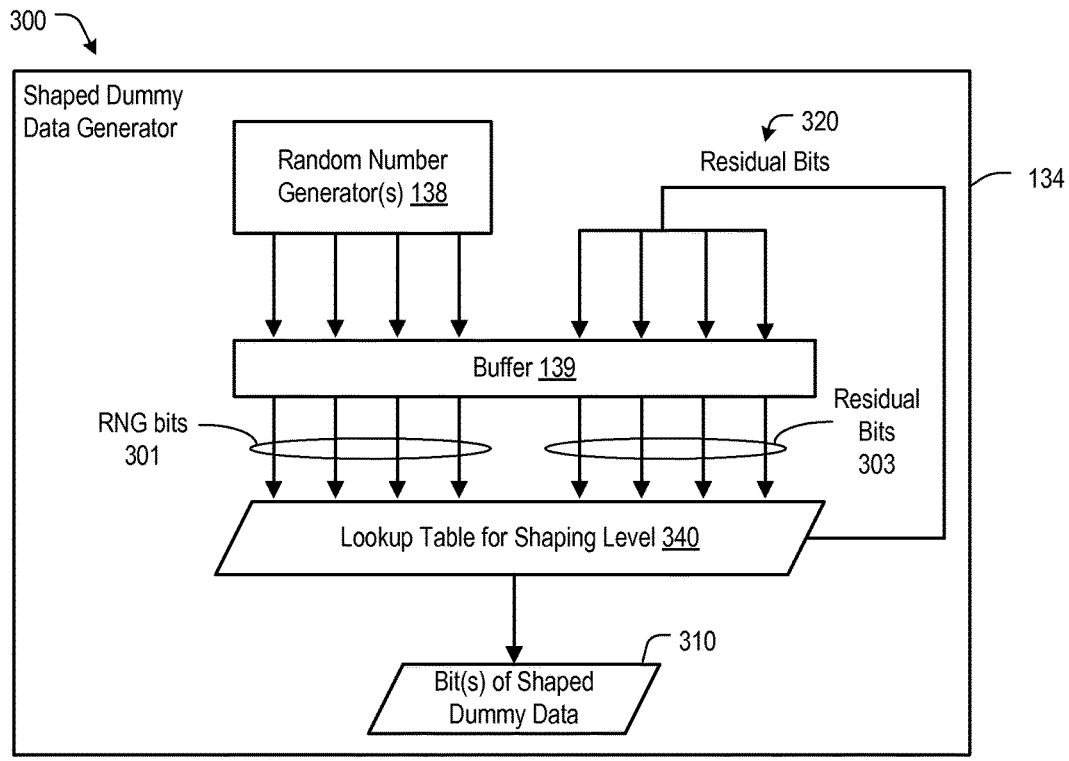
FIG. 3 is a block diagram of a first illustrative example of the shaped dummy data generator 134 of FIG. 1.

Additionally or alternatively, the lookup table(s) 140 may include one or more mapping tables, as described further with reference to FIG. 3. For example, each of the one or more mapping tables may correspond to a different shaping level. For example, the lookup table(s) 140 may include a first mapping table for a first shaping level and a second mapping table for a second shaping level. Each mapping table may be configured to indicate, in accordance with a corresponding shaping level, a data bit value to be output in response to receiving an input value, such as a four bit input value. To illustrate, given a four bit input value of "0000", the first mapping table may indicate that a corresponding output bit has a logical zero value. For a four bit input value of "1011", the first mapping table may indicate that a corresponding output bit has a logical one value. In some implementations, the lookup table(s) 140 may include logic and/or circuitry configured to perform one or more operations, such as identifying an entry in a table, comparing an input value to a table value, providing an output value, etc.

To generate the shaped dummy data 124, the shaped dummy data generator 134 may have a first configuration (e.g., a combinatorial logic configuration), as described with reference to FIG. 2, or may have a second configuration (a parallel residual configuration), as described with reference to FIG. 3.

During operation, the controller 130 is configured to receive user data 160 from the access device 170. The user data 160 may be received, via the first interface 131, along with a command from the access device 170 to write the user data 160 to the memory 104.

The controller 130 is configured to initiate writing of the user data 160 to a block, such as the group of storage elements 105, of the memory 104. In some implementations, the controller 130 may initiate writing of first data 122 (associated with the user data 160) to the memory 104. For example, the first data 122 may include a version of the user data 160, such as an encoded version of the user data 160. To illustrate, the controller 130 may receive the user data 160 from the access device 170 and provide the user data 160 to the ECC engine 133. The ECC engine 133 may encode the user data 160 to generate the first data 122 that includes one or more codewords.

The controller 130 may initiate writing of the first data 122 (e.g., the user data 160) to a first portion 106 of the first group of storage elements 105. For example, to initiate writing of the first data 122, the controller 130 may send a write command and/or the first data 122 (e.g., the user data 160) to the memory device 103. In response to receiving the first data 122, the read/write circuitry 113 may write the first data 122 to the first group of storage elements 105. For example, the read/write circuitry 113 may write the first data 122 to the first portion 106 of the first group of storage elements 105.

After the first data 122 (e.g., the user data 160) is programmed to the first group of storage elements 105, the controller 130 may determine whether the first group of storage elements 105 is partially programmed. In some implementations, the controller 130 may determine an amount (e.g., a size) of the first data 122 and may compare the amount of the first data 122 to a known storage capacity of the first group of storage elements 105. In other implementations, the read/write circuitry 113 may provide an indication of a size of the first data 122 stored at the first group of storage elements 105, a last logical address of the first group of storage elements 105 that was programmed with the first data 122 or a next logical address of the memory 104 to be programmed. Based on the indication, the controller 130 may determine whether an entirety of the first group of storage elements 105 is programmed and/or a size of an unused portion (e.g., the second portion 108) of the first group of storage elements 105. Although the controller 130 is described as determining whether an entirety of the first group of storage elements 105 is programmed based on the first data 122, in other implementations, the controller 130 may determine whether the first data 122 will fill the first group of storage elements 105 prior to the first data 122 being stored at the first group of storage elements 105.

In response to determining that the first group of storage elements 105 is partially programmed after the writing of the first data 122 (e.g., the user data 160) to the first group of storage elements 105, the shaped dummy data generator 134 may generate shaped dummy data 124 to be stored at the unused portion (e.g., the second portion 108) of the first group of storage elements 105. For example, the controller 130 may generate the shaped dummy data 124 responsive to a determination that writing of the first data 122 to the memory 104 does not fill the first group of storage elements 105. To illustrate, the controller 130 may generate the shaped dummy data 124 as described with reference to FIG. 2 or FIG. 3. The shaped dummy data 124 may be associated with the shaping level 135. In some implementations, the shaped dummy data 124 may be generated to have the same shaping level as the first data 122 (e.g., the user data 160).

The controller 130 may initiate writing of the shaped dummy data 124 to the unused portion (e.g., the second portion 108) of the first group of storage elements 105. For example, the controller 130 may send the shaped dummy data 124 to the memory device 103 and the read/write circuitry 113 may write the shaped dummy data 124 to the second portion 108 of the first group of storage elements 105. In some implementations, the shaped dummy data may be written to the second portion 108 of the first group of storage elements 105 after the first data 122 is written to the first portion 106 of the first group of storage elements 105. In other implementations, the shaped dummy data 124 may be written to the second portion 108 prior to the first data 122 being written to the first portion 106. The shaped dummy data 124 stored at the second portion 108 of the first group of storage elements 105 may reduce noise, such as cross coupling effects, experienced by data stored at the first portion 106 of the first group of storage elements 105. The shaped dummy data 124, as opposed to randomly generated dummy data, may be generated to reduce memory wear at the first group of storage elements 105.

In some implementations, the shaping level 135 and/or the lookup table(s) 140 may be stored at the memory 104. In other implementations, the controller 130 may include or may be coupled to a particular memory, such as a random access memory (RAM), that is configured to store the shaping level 135 and/or the lookup table(s) 140. Alternatively, or in addition, the controller 130 may include or may be coupled to another memory (not shown), such as a non-volatile memory, a RAM, or a read only memory (ROM). The other memory may be a single memory component, multiple distinct memory components, and/or may indicate multiple different types (e.g., volatile memory and/or non-volatile) of memory components. In some implementations, the other memory may be included in the access device 170.

Although one or more components of the data storage device 102 have been described with respect to the controller 130, in other implementations certain components may be included in the memory device 103 (e.g., the memory 104). For example, one or more of the lookup table(s) 140, the shaping level 135, the LFSR 136, the combinatorial logic 137, the buffer 139, the RNG(s) 138, the shaped dummy data generator 134, and/or the ECC engine 133 may be included in the memory device 103. Alternatively, or in addition, one or more functions as described above with reference to the controller 130 may be performed at or by the memory device 103. For example, one or more functions of the shaped dummy data generator 134 and/or the ECC engine 133 may be performed by components and/or circuitry included in the memory device 103. Alternatively, or in addition, one or more components of the data storage device 102 may be included in the access device 170. For example, one or more of the shaped dummy data generator 134 and/or the ECC engine 133 may be included in the access device 170. Alternatively, or in addition, one or more functions as described above with reference to the controller 130 may be performed at or by the access device 170. As an illustrative, non-limiting example, the access device 170 may be configured to determine a shaping level of the first data 122 to be stored at the first portion 106 of the first group of storage elements 105 and to determine a size (e.g., a number of bits) of the second portion 108 of the first group of storage elements 105. The access device 170 may be configured to generate the shaped dummy data 124 and to send the shaped dummy data 124 to the data storage device 102 to be stored at the second portion 108 of the first group of storage elements 105.

The example(s) described with reference to FIG. 1 may enable the user data 160 and the shaped dummy data 124 to be written to the same block of the memory 104. For example, if the user data 160 does not fill an entirety of the first group of storage elements 105, the shaped dummy data 124 may be written to a remainder (e.g., an un-programmed portion) of the first group of storage elements 105. By writing the shaped dummy data 124 to the same block, memory wear may be reduced and an endurance of the memory 104 may be increased as compared to data storage devices that write i.i.d. random data to the same block.

Figure 2:
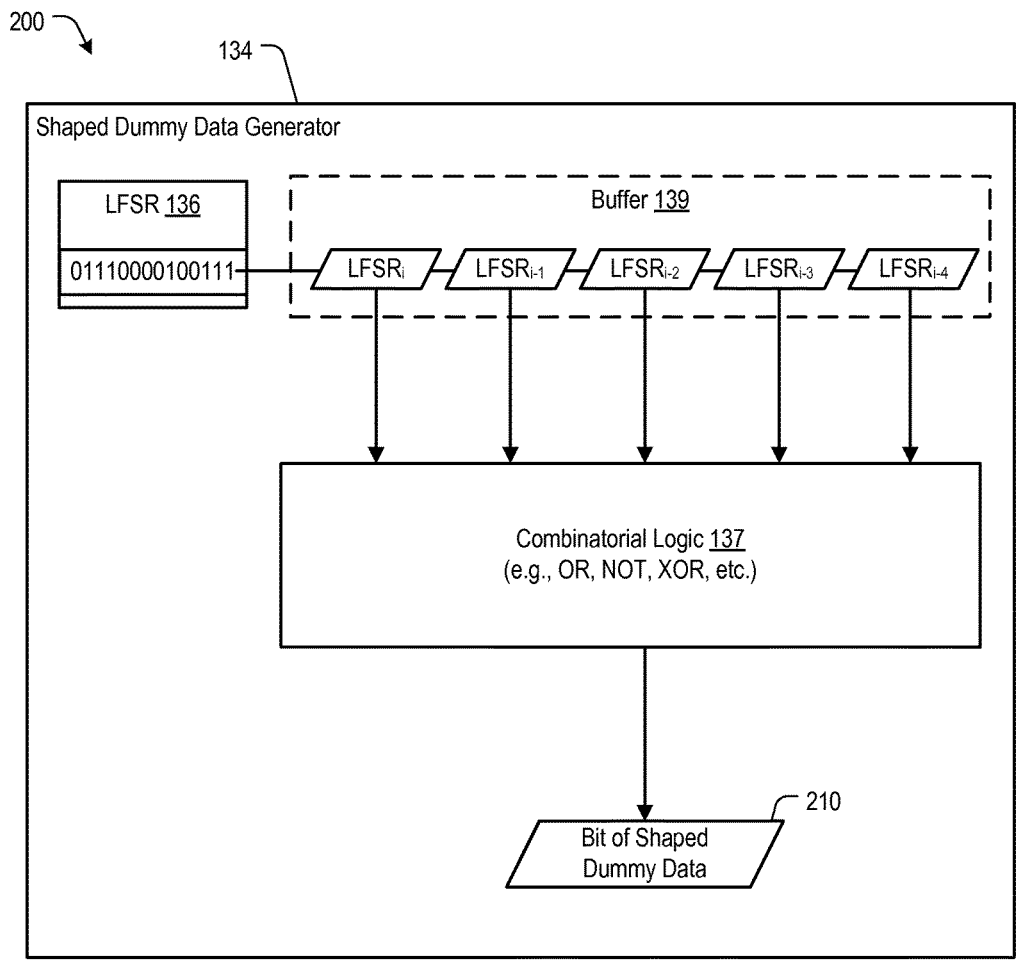
FIG. 2 is a block diagram of a first illustrative example of the shaped dummy data generator 134 of FIG. 1.

Referring to FIG. 2, a first configuration of the shaped dummy data generator 134 is illustrated and generally designated 200. In the first configuration 200 (e.g., a combinatorial logic configuration), the shaped dummy data generator 134 includes the LFSR 136 and the combinatorial logic 137. In some implementations, the shaped dummy data generator 134 having the first configuration 200 may include the buffer 139.

The LFSR 136 may be configured to generate an output of one or more bit values. For example, the LFSR 136 may generate a sequence of one or more bits, such as $LFSR_{i-4}$, $LFSR_{i-3}$, $LFSR_{i-2}$, $LFSR_{i-1}$, $LFSR_i$, etc., where i is a positive integer and may indicate a clock cycle index. In some implementations, each bit that is output by the LFSR 136 may be provided to the buffer 139, such as a first-in, first-out (FIFO) buffer.

The combinatorial logic 137 may be configured to perform one or more logical operations based on the shaping level 135. For example, the one or more logical operations may be identified using a table 250 that may be included in the one or more lookup tables 140. To illustrate, if the shaping level 135 is equal to 50% (equal ratio of 1s to 0s), the table 250 may indicate that the combinatorial logic 137 may be configured to use $LFSR_i$ to generate a bit of shaped dummy data 210 (to be included in the shaped dummy data 124). Thus, in some implementations, the combinatorial logic 137 may be configured to receive an input bit and perform no combinatorial logic operation on the input bit to generate the output bit. As another example, if the shaping level 135 is equal to 75% (75% 1s and 25% 0s), then $LFSR_i$ may be logically ORed with $LFSR_{i-1}$ to generate the bit of shaped dummy data 210. Accordingly, generating at least one bit (e.g., the bit of shaped dummy data 210) of the shaped dummy data 124 may include performing one or more combinatorial logic operations with respect to one or more bits, such as $LFSR_{i-4}$, $LFSR_{i-3}$, $LFSR_{i-2}$, $LFSR_{i-1}$, $LFSR_i$.

Referring to FIG. 3, a second configuration of the shaped dummy data generator 134 is illustrated and generally designated 300. In the second configuration 300 (e.g., a parallel residual configuration), the shaped dummy data generator 134 includes the one or more RNG(s) 138, the buffer 139, and a lookup table 340 of the one or more lookup tables 140. For example, the shaped dummy data generator 134 having the second configuration may be configured to generate shaped dummy data by processing a randomly generated sequence of bits using a parallel/residual method with the lookup table 340.

The RNG(s) 138 may include multiple RNGs, such as four RNGs, that are each configured to output a single bit during a clock cycle. The output of the RNG(s) 138 may be provided to a first portion of the buffer 139. The output of the RNG(s) 138 may be provided from the buffer 139 to the lookup table 340 as RNG bits 301. Although the RNG bits 301 are described as being provided as an input to the lookup table 340 from the buffer 139, in other implementations, the RNG bits 301 may be provided as an input to the lookup table 340 directly from the RNG(s) 138.

The lookup table 340 used by the shaped dummy data generator 134 may be selected from the one or more lookup tables 140 based on the shaping level 135. For example, the one or more lookup tables 140 may include a first table 350 and a second table 360, as illustrative, non-limiting examples. Each of the first table 350 and the second table 360 may correspond to a different shaping level. To illustrate, the first table 350 may correspond to a first shaping level of 75% logical ones and the second table 360 may correspond to a second shaping level of 68.75% logical ones.

For a given set of input bits, such as the RNG bits 301, the lookup table 340 may indicate a bit of shaped dummy data 310 to be output. To illustrate, if the first table 350 is used as the lookup table 340, the lookup table 340 may indicate that the bit of the shaped dummy data 310 is a logical zero when the set of input bits (e.g., the RNG bits 301) has the values 0000, 0001, 0010, or 0011. For the remaining twelve possible values of the set of bits (e.g., the RNG bits 301), such as value 0100-1111, the lookup table 340 may indicate that the bit of the shaped dummy data 310 is a logical one. Thus, even though four random bits are generated by the RNG(s) 138 and provided to the lookup table 340, in some situations fewer than all four bits may be needed to determine the bit of shaped dummy data 310. To illustrate, using the first table 350 associated with 75% shaping, if the first bit of set of input bits (e.g., the RNG bits 301) is a logical one, then the bit of shaped dummy data 310 will be logical one, regardless of the values of the three remaining bits. In this scenario, the three remaining bits may be considered "unused" and may be stored in the buffer 139 as a residual (e.g., residual bits 320) instead of being discarded. Accordingly, in some implementations, the lookup table 340 (e.g., the first table 350 and/or the second table 360) may indicate the residual for a given input.

The residual bits 320 may be provided to a second portion of the buffer 139. In some implementations, the second portion of the buffer 139 may be distinct and/or separate from the first portion of the buffer 139 that receives an output from the RNG(s) 138. In other implementations, the second portion of the buffer 139 may be configured to operate as a FIFO buffer. When the buffer 139 stores at least four residual bits, four residual bits (e.g., residual bits 303) may be provided as a set of input bits to the lookup table 340. The lookup table 340 may determine a bit of shaped dummy data 310 based on the residual bits 303, such as residual bits from the RNG bits 301. Additionally, the lookup table 340 may identify whether any bits of the residual bits 303 are to be provided to the buffer 139 as additional residual bits.

When the shaped dummy data generator 134 is in the second configuration 300, the RNG(s) 138 may generate a set of randomly generated bits (e.g., the RNG bits 301) that is stored at the buffer 139. The shaped dummy data generator 134 may determine a first bit of shaped dummy data (e.g., a first bit of the shaped dummy data 124) based on a first subset of the set of the RNG bits 301 and the lookup table 340. The first subset may include one bit or multiple bits, such as all of the bits, of the RNG bits 301. If the first subset includes less than all of the RNG bits 301, a second subset of the RNG bits 301 may be stored in the buffer 139 as the residual bits 320. Concurrently with providing the RNG bits 301 to the lookup table 340, if the buffer 139 includes four or more residual bits, four residual bits may be provided as another input to the lookup table 340. Accordingly, the shaped dummy data generator 134 may output a second bit of shaped dummy data (e.g., a second bit of the shaped dummy data 124) based at least in part on the residual bits 303 and the lookup table 340.

Although the shaped dummy data generator 134 having the second configuration 300 has been described as having input data that include four bits, in other implementations, an input value of the lookup table 340 may include more than four bits or fewer than four bits.

Figure 4:
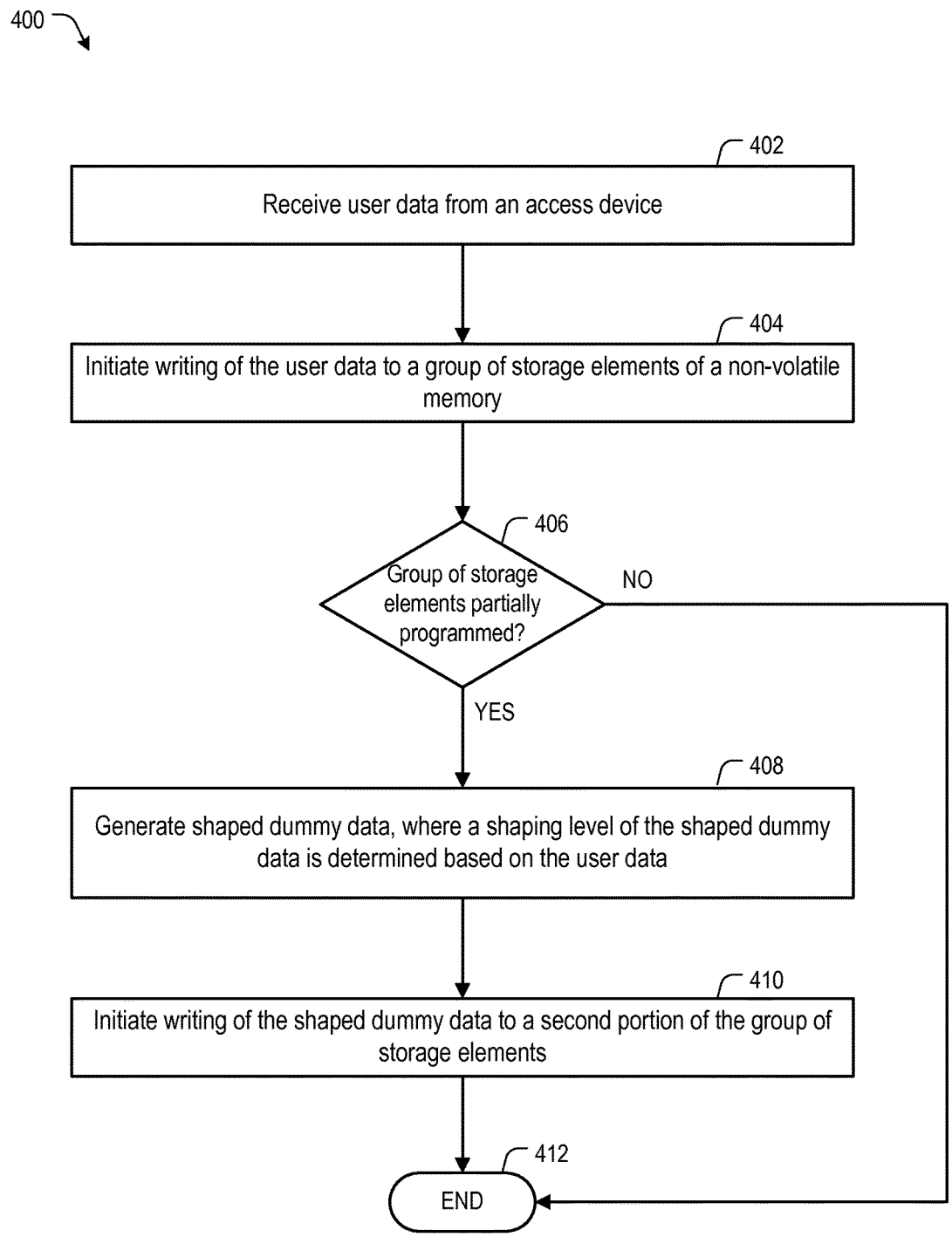
FIG. 4 is a flowchart of a particular illustrative example of a method of generating shaped dummy data.

Referring to FIG. 4, a particular illustrative example of a method of generating shaped dummy data is depicted and generally designated 400. The method 400 may be performed at the data storage device 102, such as the controller 130 or the shaped dummy data generator 134, and/or the access device 170 of FIG. 1, or a combination thereof, as illustrative, non-limiting examples.

The method 400 may include receiving user data from an access device, at 402. For example, referring to FIG. 1, the data storage device 102 may receive the user data 160 from the access device 170.

The method 400 may also include initiating writing of the user data to a group of storage elements of a non-volatile memory, at 404. For example, the non-volatile memory may include the memory 104 of FIG. 1. The non-volatile memory may be included in or coupled to the data storage device. The non-volatile memory may include a flash memory, such as a NAND flash memory. The group of storage elements may be configured as a page, a word line, or a block of the non-volatile memory. For example, the group of storage elements may include or correspond to the first group of storage elements 105 of FIG. 1.

The method 400 may include determining whether the group of storage elements is partially programmed, at 406. In some implementations, determining whether the group of storage elements is partially programmed may occur in response to writing the user data to the group of storage elements. In response to determining that the group of storage elements is not partially programmed, the method 400 may end at 412. Alternatively, in response to determining that the group of storage elements is partially programmed, the method 400 may advance to 408.

At 408, the method 400 may include generating shaped dummy data. A shaping level of the shaped dummy data may be determined based on the user data. The shaping level may include or correspond to the shaping level 135 of FIG. 1. In some implementations, the shaping level of the shaped dummy data may be the same as a determined shaping level of the user data. In other implementations, the shaping level may be selected from a set of multiple available shaping levels.

The method 400 may further include initiating writing of the shaped dummy data to a second portion of the group of storage elements, at 410. For example, referring to FIG. 1, the controller 130 may initiate writing of the shaped dummy data 124 to the second portion 108 of the first group of storage elements 105. The shaped dummy data 124 may be written to the second portion 108 by the read/write circuitry 113 of the memory device 103. In some implementations, the shaped dummy data is generated and written to the second portion of the group of storage elements responsive to a determination that the writing of the first data does not fill the group of storage elements After initiation writing of the shaped dummy data, the method 400 may end at 412.

By writing the shaped dummy data to the same group of storage elements as the user data, noise experienced at the group of storage elements during read operations may be reduced. The reduced amount of noise may result in fewer read errors based on data read from the group of storage elements that includes the user data and the shaped dummy data. Additionally, by writing the shaped dummy data to the same group of storage elements as the user data, memory wear may be reduced and a reduced of the memory 104 may be increased.

Figure 5A:
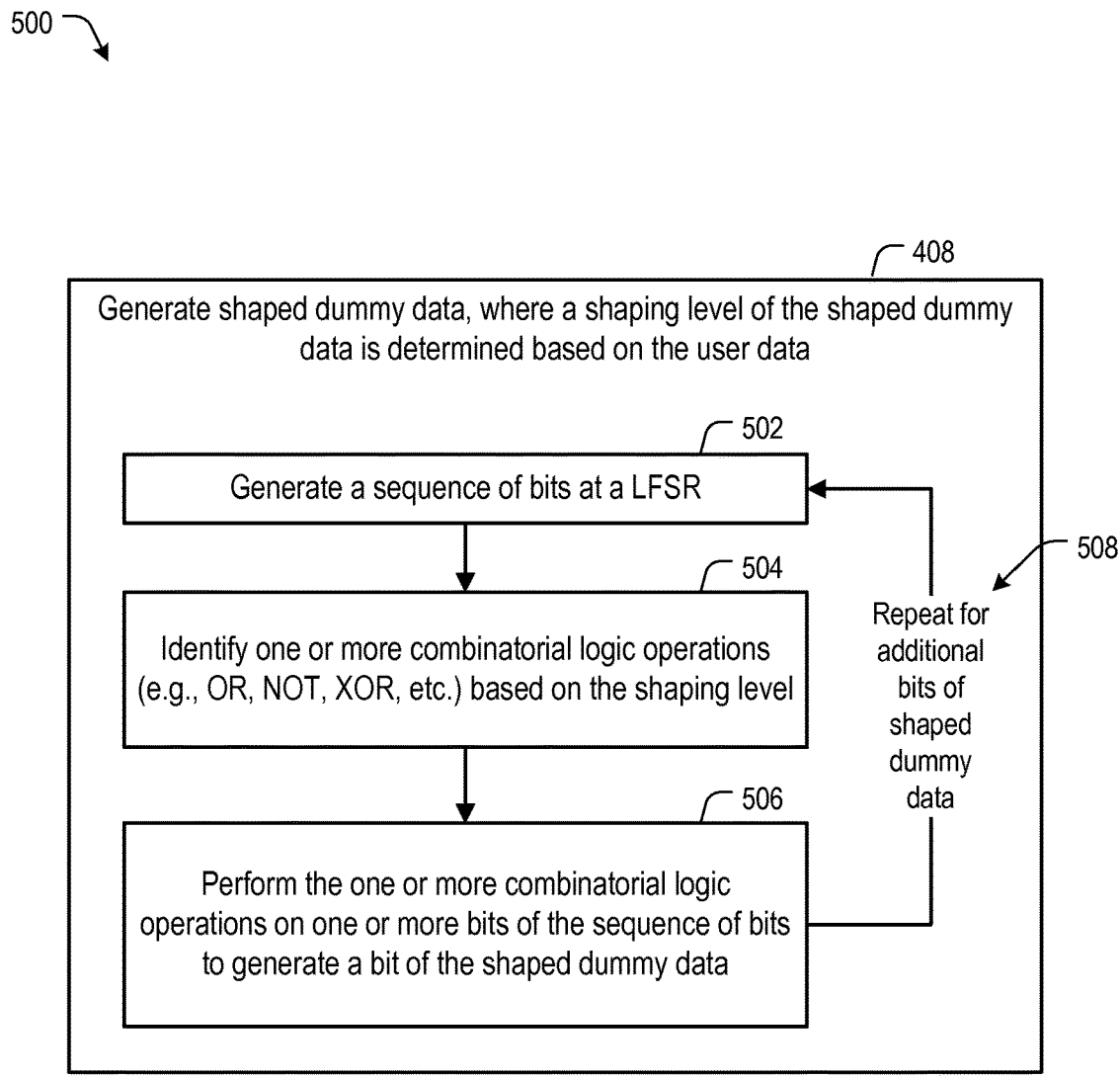
FIG. 5A is a flowchart of another particular illustrative example of a method of generating shaped random data.

Referring to FIG. 5A, a first illustrative example of a method of generating shaped dummy data is depicted and generally designated 500. The method 500 may include or correspond to generating shaped dummy data, at 408, of the method 400 of FIG. 4. The method 500 may be performed at the data storage device 102, such as the controller 130 or the shaped dummy data generator 134, and/or the access device 170 of FIG. 1, or a combination thereof, as illustrative, non-limiting examples.

The method 500 may include generating a sequence of bits at a linear feedback shift register (LFSR), at 502. For example, the LFSR may include or correspond to the LFSR 136 of FIG. 1. In some implementations, the sequence of bits may include 32 bits.

The method 500 may also include identifying one or more combinational logic operations based on a shaping level, at 504. The shaping level may include or correspond to the shaping level 135 of FIG. 1. The one or more combinational logical operations may be identified using a table, such as one of the lookup tables 140 of FIG. 1 or the table 250 of FIG. 2. The one or more combinational logic operations may include an OR operation, an AND operation, an XOR operation, or a combination thereof, as illustrative, non-limiting examples.

The method 500 may further include performing the one or more combination logic operations on one or more bits of the sequence of bits to generate a bit of the shaped dummy data, at 506. The one or more combinational logic operations may be performed by the combinatorial logic 137 of FIG. 1. The bit of the shaped dummy data may include or correspond to a bit of the shaped dummy data 124 of FIG. 1 or the bit of shaped dummy data 210 of FIG. 2. The method 500 may include repeating the operations at 502-506 for additional bits of shaped dummy data, at 508, and may advance to 502. If no additional bits are to be generated for the shaped data, the method 500 may end.

Figure 5B:
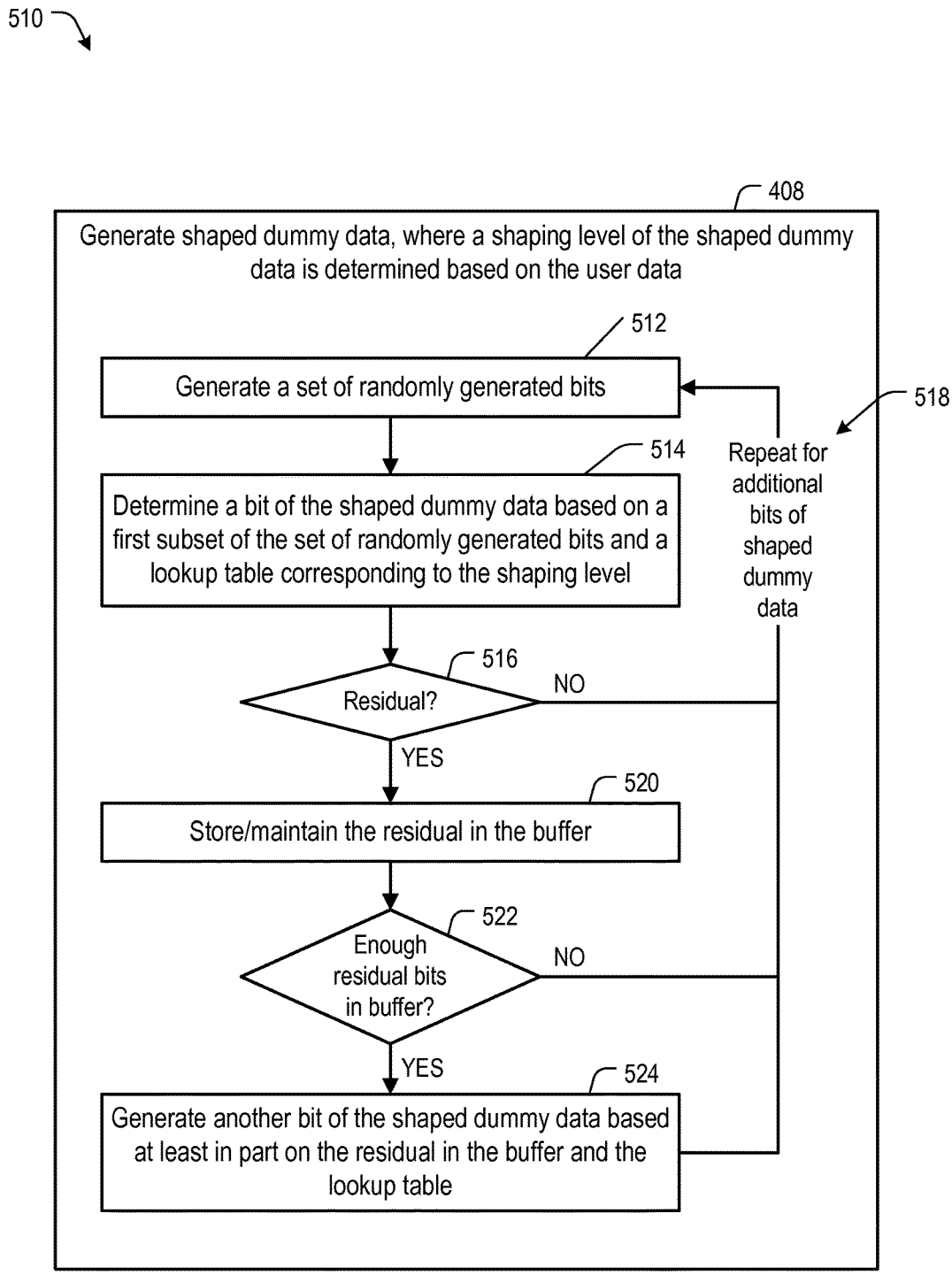
FIG. 5B is a flowchart of another particular illustrative example of a method of generating shaped random data.

Referring to FIG. 5B, a first illustrative example of a method of generating shaped dummy data is depicted and generally designated 510. The method 510 may include or correspond to generating shaped dummy data, at 408, of the method 400 of FIG. 4. The method 510 may be performed at the data storage device 102, such as the controller 130 or the shaped dummy data generator 134, and/or the access device 170 of FIG. 1, or a combination thereof, as illustrative, non-limiting examples.

The method 510 may include generating a set of randomly generated bits, at 512. The set of randomly generated bits may be generated by a parallel random number generator, such as the parallel random number generator 138 of FIG. 1. The set of randomly generated bits may be stored in a buffer, such as the buffer 139 of FIG. 1.

The method 510 may include determining a bit of the shaped dummy data based on a first subset of the set of randomly generated bits and a lookup table corresponding to the shaping level, at 514. For example, referring to FIG. 1, a bit of the shaped dummy data 124 may be determined based on the set of randomly generated bits and the lookup table 140 corresponding to the shaping level 135. To illustrate, if the shaping level is 75% logical ones, the lookup table may correspond to the lookup table 350 of FIG. 3. Alternatively, if the shaping level is 68.75% logical ones, the lookup table may correspond to the second table 360 of FIG. 3. The lookup table may include a value of the bit of the shaped data.

The method 510 may include determining whether there is a residual, at 516. In some implementations, determining whether there is a residual may be based on the lookup table. For example, the lookup table may indicate whether there is a residual and, if so, a value of the residual. If there is no residual, the method 510 include repeating on or more operations of the method 510 for an additional bit(s) of shaped dummy data, at 518, and may advance to 512. If no additional bits are needed for the shaped data, the method 510 may end. Alternatively, if there is a residual, the method 510 may advance to 520. The method 510 may include storing/maintaining the residual in the buffer, at 520.

The method 510 may include determining whether there are enough residual bits stored in the buffer to determine a shaped data bit, at 522. For example, a determination may be made whether there are enough residual bits to be provided as an input to a look up table, such as the lookup table 340 of FIG. 3. If there are not enough residual bits, the method 510 may include repeating on or more operations of the method 510 for an additional bit(s) of shaped dummy data, at 518, and may advance to 512. If no additional bits are needed for the shaped data, the method 510 may end. Alternatively, if there are enough residual bits, the method 510 may advance to 524.

The method 510 may include generating another bit of the shaped dummy data based at least in part on the residual in the buffer and the lookup table, at 524. For example, the residual bits stored in the buffer may be used as an input value of the lookup table to determine another bit value of the shaped data. If another bit of the shaped dummy data is not needed prior to advancing to 524, the method 510 may end.

Figure 6A:
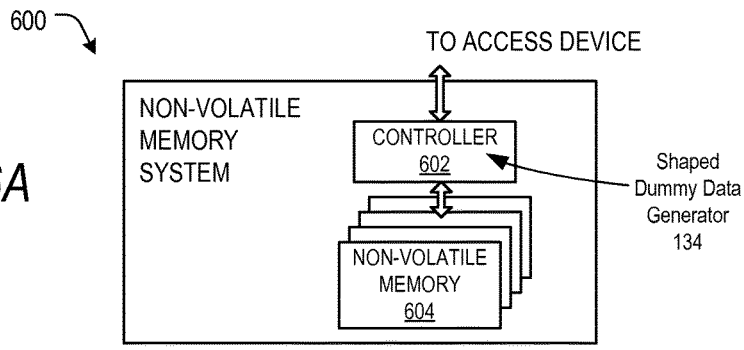
FIG. 6A is a block diagram of an illustrative example of a non-volatile memory system including a controller that includes a shaped dummy data generator.

Additional examples of systems and devices suitable for use in implementing aspects of the disclosure are shown in FIGS. 6A-6C and FIGS. 7A-7B. FIG. 6A is a block diagram illustrating a non-volatile memory system 600 according to an aspect of the subject matter described herein. Referring to FIG. 6A, the non-volatile memory system 600 includes a controller 602 and non-volatile memory that may be made up of one or more non-volatile memory dies, including an illustrative non-volatile memory die 604. The controller 602 may include the shaped dummy data generator 134. The non-volatile memory system 600 may include or correspond to the data storage device 102 of FIG. 1. For example, the controller 602 and the non-volatile memory die 604 may include the controller 130 and the memory 104, respectively, of FIG. 1. A "memory die" may refer to a collection of non-volatile memory cells, and associated circuitry for managing the physical operation of those non-volatile memory cells, that are formed on a single semiconductor substrate. The controller 602 interfaces with an access system, such as a host system, and transmits command sequences for read, program, and erase operations to non-volatile memory dies, such as the illustrative non-volatile memory die 604.

The controller 602 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and/or an embedded microcontroller, as illustrative, non-limiting examples. The controller 602 can be configured with hardware and/or firmware to perform the various functions described below and shown in the flow diagrams. Also, some of the components shown as being internal to the controller 602 can be stored external to the controller 602, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with an access device, such as a computer or electronic device. A flash memory controller can have additional functionality other than the specific functionality described herein. For example, the flash memory controller can format a flash memory so that the flash memory is operating properly, map out bad flash memory cells, and allocate spare cells to be substituted for future failed cells. Some part of the spare cells can be used to hold firmware to operate the flash memory controller and implement other features. In operation, an access device communicates with the flash memory controller to read data from or write data to the flash memory. If the access device provides a logical address to which data is to be read/written, the flash memory controller can convert the logical address received from the access device to a physical address in the flash memory. In an alternative implementation, the access device can provide the physical address to the flash memory controller. The flash memory controller can also perform various memory management functions, such as, but not limited to, wear leveling (distributing writes to avoid wearing out specific blocks of memory that would otherwise be repeatedly written to) and/or garbage collection (after a block is full, moving only the valid pages of data to a new block, so the full block can be erased and reused), as illustrative, non-limiting examples.

The non-volatile memory die 604 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 602 and the non-volatile memory die 604 may be any suitable interface, such as a Toggle Mode interface. In some implementations, non-volatile memory system 600 may be a card based system, such as a secure digital (SD) or a micro secure digital (micro-SD) card. Alternatively, in other implementations, the non-volatile memory system 600 may be part of an embedded memory system.

Although, in the example illustrated in FIG. 6A, the non-volatile memory system 600 (sometimes referred to herein as a storage module) includes a single channel between the controller 602 and the non-volatile memory die 604, the subject matter described herein is not limited to having a single memory channel. For example, in some NAND memory system architectures (such as the ones shown in FIGS. 6B and 6C), two, four, eight or more NAND channels may be present between the controller and the NAND memory device, depending on controller capabilities. In any of the examples described herein, more than a single channel may be present between the controller 602 and the non-volatile memory die 604, even if a single channel is shown in the drawings.

Figure 6B:
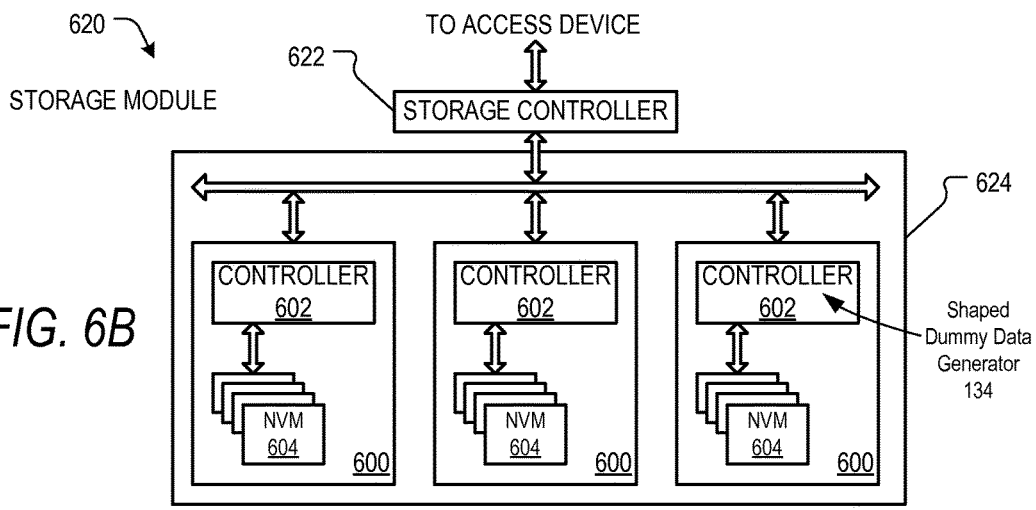
FIG. 6B is a block diagram of an illustrative example of a storage module that includes plural non-volatile memory systems that each may include a controller having a shaped dummy data generator.

FIG. 6B illustrates a storage module 620 that includes a plurality of the non-volatile memory systems 600. As such, the storage module 620 may include a storage controller 622 that interfaces with an access device and with a storage system 624, which includes the plurality of the non-volatile memory systems 600. The interface between the storage controller 622 and the non-volatile memory systems 600 may be a bus interface, such as a serial advanced technology attachment (SATA) or a peripheral component interface express (PCIe) interface. In some implementations, the storage module 620 may be a solid state drive (SSD) which may be found in portable computing devices, such as laptop computers and tablet computers, as illustrative, non-limiting examples. Each storage controller 602 of FIG. 6B may include a shaped dummy data generator, such as the shaped dummy data generator 134. Alternatively or in addition, the storage controller 622 may include a shaped dummy data generator corresponding to the shaped dummy data generator 134.

Figure 6C:
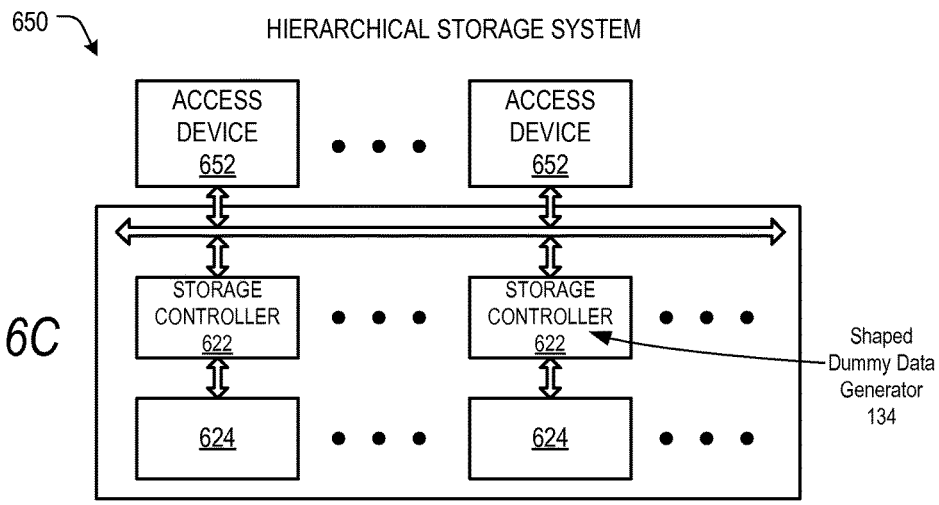
FIG. 6C is a block diagram of an illustrative example of a hierarchical storage system that includes a plurality of storage controllers that each may include a shaped dummy data generator.

FIG. 6C is a block diagram illustrating a hierarchical storage system 650 that includes a plurality of the storage controllers 622, each of which controls a respective storage system 624. Access device systems 652 may access memories within the hierarchical storage system 650 via a bus interface. The bus interface may be a non-volatile memory (NVM) express (NVMe) or a fiber channel over Ethernet (FCoE) interface, as illustrative, non-limiting examples. In some implementations, the hierarchical storage system 650 illustrated in FIG. 6C may be a rack mountable mass storage system that is accessible by multiple access devices (e.g., host computers), such as would be found in a data center or other location where mass storage is needed. Each storage controller 622 of FIG. 6B may include a shaped dummy data generator, such as the shaped dummy data generator 134.

Figure 7A:
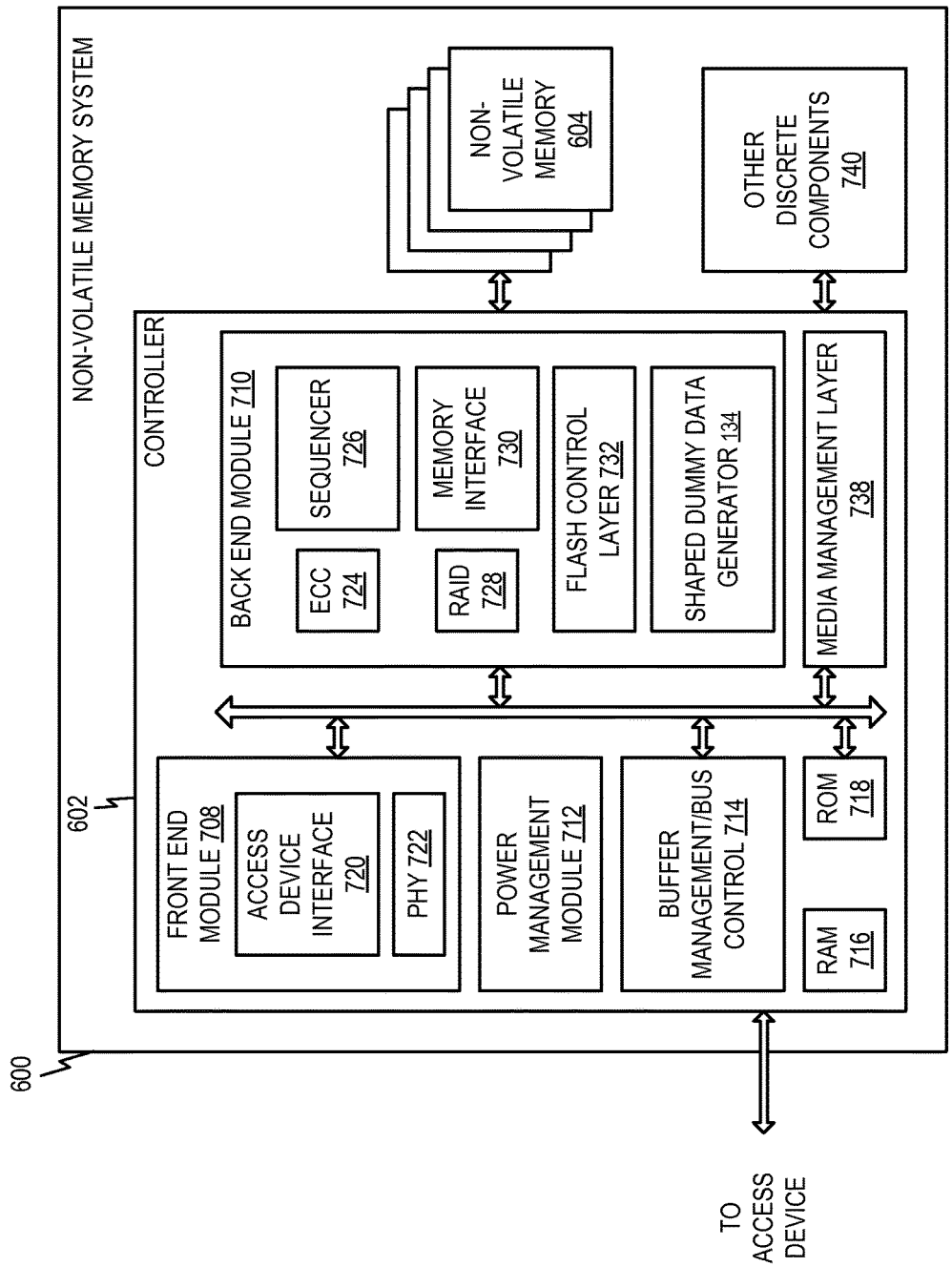
FIG. 7A is a block diagram illustrating an example of a non-volatile memory system including a controller that may include a shaped dummy data generator.

FIG. 7A is a block diagram illustrating exemplary components of the controller 602 in more detail. The controller 602 includes a front end module 708 that interfaces with an access device, such as the access device 170 of FIG. 1. The controller 602 also includes a back end module 710 that interfaces with non-volatile memory dies (e.g., including the non-volatile memory die 604), and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 602, a buffer management/bus controller 714 manages buffers in a random access memory (RAM) 716 and controls internal bus arbitration of the controller 602. A read only memory (ROM) 718 stores system boot code. Although illustrated in FIG. 7A as located within the controller 602, in other implementations, one or both of the RAM 716 and the ROM 718 may be located externally to the controller 602. In other implementations, portions of the RAM 716 and/or the ROM 718 may be located both within the controller 602 and outside the controller 602.

The front end module 708 includes an access device interface 720 and a physical layer interface (PHY) 722 that provide an electrical interface with the access device or a next level storage controller. The access device interface 720 may include the first interface 131 of FIG. 1. A type of the access device interface 720 can depend on the type of memory being used. Examples of the access device interface 720 include, but are not limited to, serial advanced technology attachment (SATA), SATA Express, serial attached small computer system interface (SAS), Fibre Channel, universal serial bus (USB), peripheral component interconnect express (PCIe), and NVMe. The access device interface 720 typically facilitates transfer for data, control signals, and timing signals, as illustrative, non-limiting examples.

The back end module 710 includes an error correction code (ECC) engine 724 that encodes data, such as data bytes, received from the access device, and decodes and error corrects representations of the data (e.g., representations of the data bytes) read from non-volatile memory, such as the non-volatile memory die 604. For example, the ECC engine 724 may include the ECC engine 133 of FIG. 1. The back end module 710 may also include the shaped dummy data generator 134. A command sequencer 726 may generate command sequences, such as program and erase command sequences, to be transmitted to the non-volatile memory die 604. A redundant array of independent drives (RAID) module 728 manages generation of RAID parity and recovery of failed data. The RAID parity may be used as an additional level of integrity protection for the data being written into the non-volatile memory die 604. In some cases, the RAID module 728 may be a part of the ECC engine 724. A memory interface 730 provides the command sequences to the non-volatile memory die 604 and receives status information from the non-volatile memory die 604. For example, the memory interface may include the second interface 132 of FIG. 1. In some implementations, the memory interface 730 may be a double data rate (DDR) interface, such as a Toggle Mode interface. A flash control layer 732 controls the overall operation of back end module 710.

Additional components of the non-volatile memory system 600 illustrated in FIG. 7A include a power management module 712 and a media management layer 738, which performs wear leveling of memory cells of the non-volatile memory die 604. The non-volatile memory system 600 also includes other discrete components 740, such as external electrical interfaces, external RAM, resistors, capacitors, or other components, that may interface with the controller 602. In some implementations, one or more of the physical layer interface 722, the RAID module 728, the media management layer 738, and/or the buffer management/bus controller 714 are optional components that may be omitted from the controller 602.

Figure 7B:
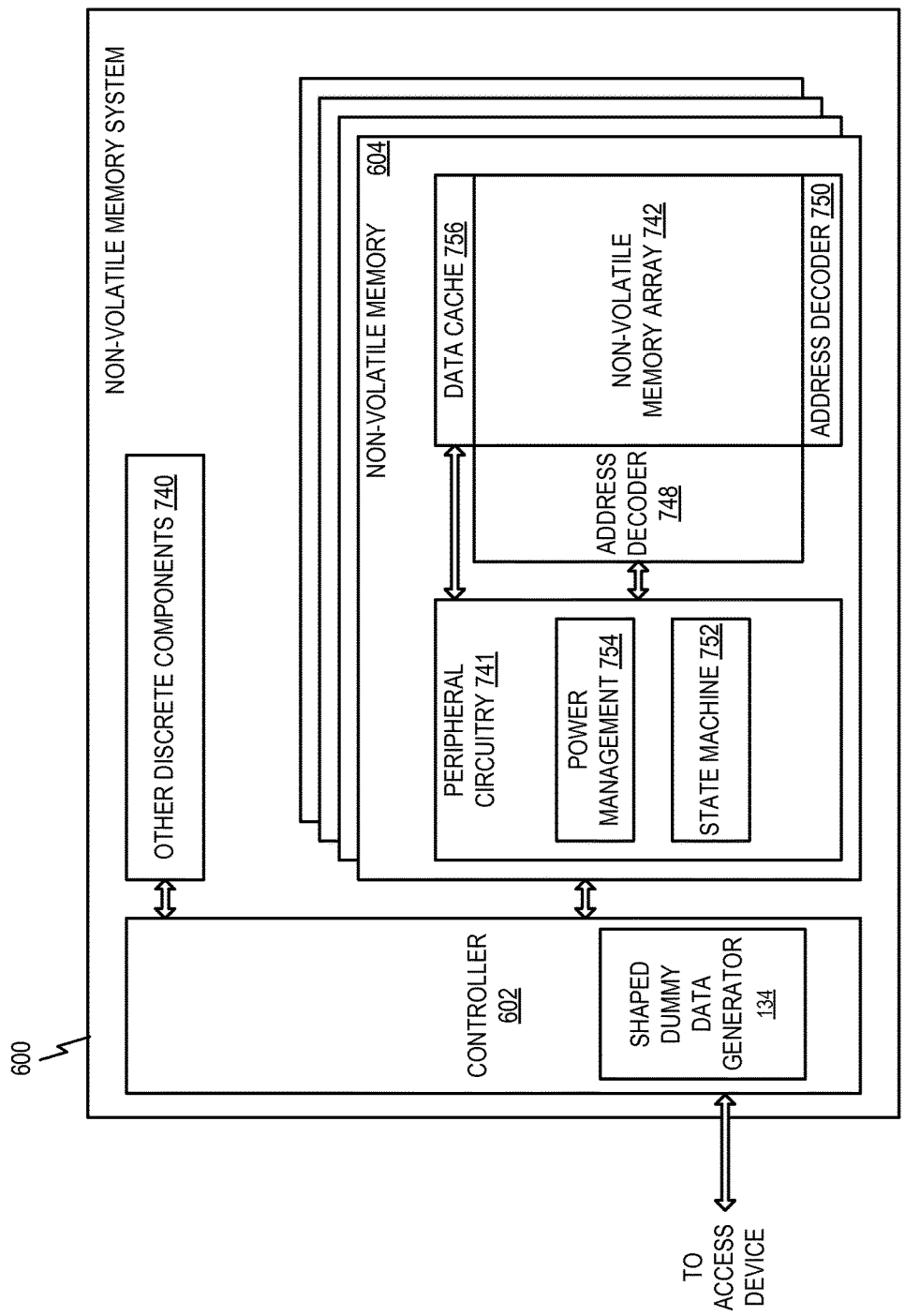
FIG. 7B is a block diagram illustrating exemplary components of a non-volatile memory die that may be coupled to a controller that includes a shaped dummy data generator.

FIG. 7B is a block diagram illustrating exemplary components of the non-volatile memory die 604 in more detail. The non-volatile memory die 604 includes peripheral circuitry 741 and a non-volatile memory array 742. The non-volatile memory array 742 includes non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 741 includes a power management module 754 and a state machine 752 that provides status information to the controller 602. The controller 602 may also include the shaped dummy data generator 134. The non-volatile memory die 604 further includes discrete components 740, an address decoder 748, an address decoder 750, and a data cache 756 that caches data.

Although various components of the data storage device 102, such as the shaped dummy data generator 134, the access device 170 of FIG. 1, the non-volatile memory system 600 of FIG. 6A, the storage module 620 of FIG. 6B, and/or the hierarchical storage system 650 of FIG. 6C are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method the method 400 of FIG. 4, the method 500 of FIG. 5A, and/or the method 510 of FIG. 5B.

Alternatively or in addition, one or more aspects of the data storage device 102, such as the shaped dummy data generator 134, the access device 170 of FIG. 1, the non-volatile memory system 600 of FIG. 6A, the storage module 620 of FIG. 6B, and/or the hierarchical storage system 650 of FIG. 6C may be implemented using a microprocessor or microcontroller programmed (e.g., by executing instructions) to perform operations described herein, such as one or more operations of the method 400 of FIG. 4, one or more operations of the method 500 of FIG. 5A, and/or on or more operations of the method 510 of FIG. 5B, as described further herein. As an illustrative, non-limiting example, the non-volatile memory system 600 includes a processor executing instructions (e.g., firmware) retrieved from the non-volatile memory die 604. Alternatively or in addition, instructions that are executed by the processor may be retrieved from a separate memory location that is not part of the non-volatile memory die 604, such as at a read-only memory (ROM).

In some implementations, each of the controller 130, the memory device 103, and/or the access device 170 of FIG. 1 may include a processor executing instructions that are stored at a memory, such as a non-volatile memory of the data storage device 102 or the access device 170 of FIG. 1. Alternatively or additionally, executable instructions that are executed by the processor may be stored at a separate memory location that is not part of the non-volatile memory, such as at a read-only memory (ROM) of the data storage device 102 or the access device 170 of FIG. 1.

With reference to FIG. 1, the data storage device 102 may be attached to or embedded within one or more access devices, such as within a housing of the access device 170. For example, the data storage device 102 may be embedded within the access device 170 in accordance with a Joint Electron Devices Engineering Council (JEDEC) Solid State Technology Association Universal Flash Storage (UFS) configuration. To further illustrate, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other implementations, the data storage device 102 may be implemented in a portable device configured to be selectively coupled to one or more external access devices. For example, the data storage device 102 may be removable from the access device 170 (i.e., "removably" coupled to the access device 170). As an example, the data storage device 102 may be removably coupled to the access device 170 in accordance with a removable universal serial bus (USB) configuration. In still other implementations, the data storage device 102 may be a component (e.g., a solid-state drive (SSD)) of a network accessible data storage system, such as an enterprise data system, a network-attached storage system, a cloud data storage system, etc.

The memory 104, the memory device 103 of FIG. 1, the non-volatile memory 604 of FIG. 6B, the RAM 716, the ROM 718 of FIG. 7A, and/or the non-volatile memory array 742 of FIG. 7B may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104, the memory device 103 of FIG. 1, the non-volatile memory 604 of FIG. 6B, the RAM 716, the ROM 718 of FIG. 7A, and/or the non-volatile memory array 742 of FIG. 7B may include another type of memory. In some implementations, one or more of the memory 104, the memory device 103 of FIG. 1, the non-volatile memory 604 of FIG. 6B, the RAM 716, the ROM 718 of FIG. 7A, and/or the non-volatile memory array 742 of FIG. 7B may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
a non-volatile memory; and
a controller coupled to the non-volatile memory, the controller configured to:
initiate writing of first data to a first portion of a group of storage elements of the non-volatile memory; and
initiate writing of shaped dummy data to a second portion of the group of storage elements, at least one bit of the shaped dummy data based on one or more of: combinatorial logic and a combinatorial logic operation; a linear feedback shift register and a feedback shift operation; a lookup operation based on a lookup table and one or more random bits; a residual generated at the controller based on at least one other bit of the shaped dummy data; or a logical value in the first data.

2. The device of claim 1, wherein the group of storage elements comprises a block of NAND flash memory, and wherein the first data comprises user data received from an access device.

3. The device of claim 1, wherein the non-volatile memory is configured to, in response to initiation of the writing of the shaped dummy data, write the shaped dummy data to the second portion of the group of storage elements after the first data is written to the first portion of the group of storage elements.

4. The device of claim 1, wherein the controller is further configured to initiate the writing of the shaped dummy data responsive to a determination that the writing of the first data does not fill the group of storage elements.

5. The device of claim 1, wherein the shaped dummy data is based on a counted number of bits of the first data that have a logical one value.

6. The device of claim 5, wherein the combinatorial logic is configured to perform one or more combinatorial logic operations with respect to one or more bits input to the combinatorial logic to generate a bit of the shaped dummy data.

7. The device of claim 6, wherein the linear feedback shift register is configured to perform the feedback shift operation to generate the one or more bits.

8. The device of claim 6, wherein the one or more combinatorial logic operations include an OR operation, a NOT operation, an XOR operation, or any combination thereof.

9. The device of claim 6, further comprising hardware circuitry configured to perform the one or more combinatorial logic operations.

10. The device of claim 6, wherein the controller includes a processor configured to execute software instructions to cause the processor to perform the one or more combinatorial logic operations.

11. A data storage device comprising:
a non-volatile memory; and
a controller configured to:
initiate writing of user data to a group of storage elements of the non-volatile memory;
determine that the group of storage elements is partially programmed after the writing of the user data to the group of storage elements; and
initiate writing of shaped dummy data to an unused portion of the group of storage elements, at least one bit of the shaped dummy data based on one or more of: combinatorial logic and a combinatorial logic operation; a linear feedback shift register and a feedback shift operation; a lookup operation based on a lookup table and one or more random bits; a residual generated at the controller based on at least one other bit of the shaped dummy data; or a logical value in the user data.

12. The data storage device of claim 11, wherein the controller is further configured to generate the shaped dummy data based on a shaping level of the shaped dummy data that is determined based on particular user data from a host device.

13. The data storage device of claim 11, wherein the non-volatile memory includes:
a three-dimensional (3D) memory configuration that is monolithically formed in one or more physical levels of arrays of storage elements, the one or more physical levels of arrays of storage elements having an active area disposed above a silicon substrate; and
circuitry associated with operation of the storage elements.

14. A method comprising:
in a device including a controller and a non-volatile memory, performing:
initiating writing of first data to a first portion of a group of storage elements of the non-volatile memory; and
initiating writing of shaped dummy data to a second portion of the group of storage elements, at least one bit of the shaped dummy data based on one or more of a combinatorial logic operation performed at combinatorial logic, a feedback shift operation performed at a linear feedback shift register, a lookup operation based on a lookup table and one or more random bits, a residual generated at the controller based on at least one other bit of the shaped dummy data, or a logical value in the first data.

15. The method of claim 14, wherein the combinatorial logic operation includes one or more logic operations performed with respect to one or more bits generated by the linear feedback shift register.

16. The method of claim 14, wherein the lookup operation is based on a particular residual stored in a buffer during generation of the at least one other bit of the shaped dummy data.

17. The method of claim 14, further comprising generating a first bit of the shaped dummy data by:
generating a set of randomly generated bits in a buffer;
determining the first bit of the shaped dummy data based on a first subset of the set of randomly generated bits and the lookup table, the lookup table corresponding to a shaping level of the shaped dummy data; and
storing a second subset of the set of randomly generated bits as the residual in the buffer.

18. The method of claim 17, further comprising generating a second bit of the shaped dummy data by determining the second bit based at least in part on the residual and the lookup table.

19. An apparatus comprising:
means for storing data; and
means for controlling the means for storing data, the means for controlling configured to:
initiate writing of first data to a first portion of a group of storage elements of the means for storing data; and
initiate writing of shaped dummy data to a second portion of the group of storage elements, at least one bit of the shaped dummy data based on one or more of means for performing a combinatorial logic operation, means for performing a feedback shift operation, means for performing a lookup table operation based on one or more random bits, means for generating a residual based on at least one other bit of the shaped dummy data, or a logical value in the first data.

20. The apparatus of claim 19, wherein the means for controlling is further configured to count a number of bits of the first data having a logical one value to determine a shaping level of the shaped dummy data, and wherein the shaped dummy data is generated based on the shaping level.

* * * * *